(12) United States Patent
Sullam

(10) Patent No.: US 6,967,511 B1
(45) Date of Patent: Nov. 22, 2005

(54) METHOD FOR SYNCHRONIZING AND RESETTING CLOCK SIGNALS SUPPLIED TO MULTIPLE PROGRAMMABLE ANALOG BLOCKS

(75) Inventor: Bert Sullam, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 239 days.

(21) Appl. No.: 09/969,311

(22) Filed: Oct. 1, 2001

Related U.S. Application Data

(60) Provisional application No. 60/243,708, filed on Oct. 26, 2000.

(51) Int. Cl.[7] .................................................. H03L 7/00
(52) U.S. Cl. ....................................... 327/144; 327/337
(58) Field of Search ................................ 327/144, 145, 327/337, 564–566

(56) References Cited

U.S. PATENT DOCUMENTS

| | | | | |
|---|---|---|---|---|
| 5,258,760 A | * | 11/1993 | Moody et al. | 341/166 |
| 5,414,308 A | * | 5/1995 | Lee et al. | 327/293 |
| 5,563,526 A | * | 10/1996 | Hastings et al. | 326/37 |
| 5,600,262 A | * | 2/1997 | Kolze | 326/38 |
| 6,166,367 A | * | 12/2000 | Cho | 250/208.1 |
| 6,225,866 B1 | * | 5/2001 | Kubota et al. | 330/295 |
| 6,724,220 B1 | * | 4/2004 | Snyder et al. | 326/39 |

* cited by examiner

*Primary Examiner*—Kenneth B. Wells
(74) *Attorney, Agent, or Firm*—Wagner, Murabito & Hao LLP

(57) ABSTRACT

A method for establishing frequency and phase alignment of clock signals across a domain of analog blocks coupled in a single integrated circuit. Different analog functions are implemented by selectively and electrically coupling different combinations of analog blocks. The analog blocks may be arrayed in a number of columns. A synchronized clock signal is supplied to all of the analog blocks in a combination of blocks, even when the blocks are in different columns. The frequency of the clock signal can be changed dynamically depending on the analog function to be achieved.

25 Claims, 15 Drawing Sheets

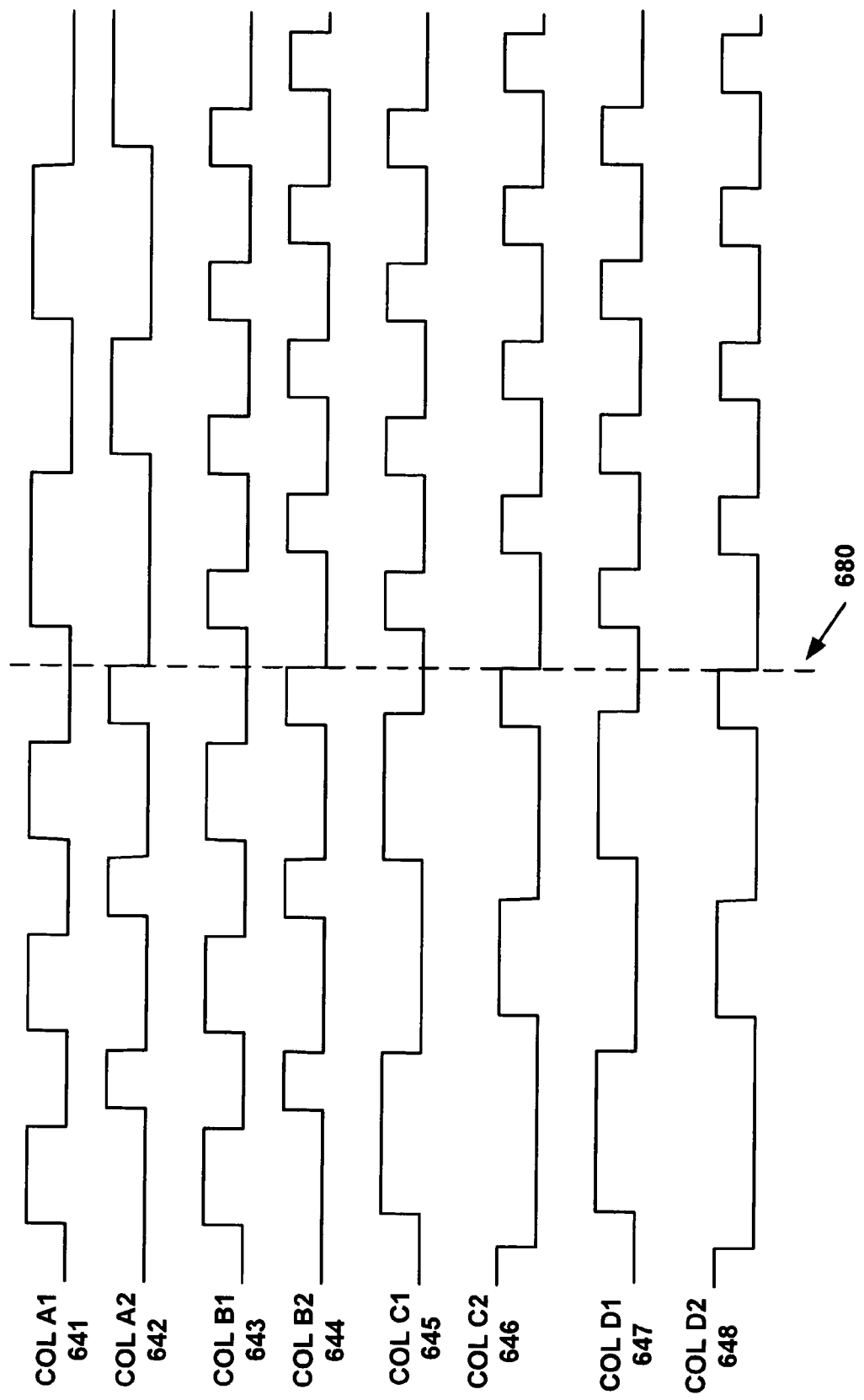

METHOD FOR SYNCHRONIZING AND RESETTING CLOCK SIGNALS SUPPLIED TO MULTIPLE PROGRAMMABLE ANALOG BLOCKS

RELATED U.S. APPLICATION

This application claims priority to the provisional patent application, Ser. No. 60/243,708, entitled "Advanced Programmable Microcontroller Device," with filing date Oct. 26, 2000, and assigned to the assignee of the present application.

TECHNICAL FIELD

The present invention generally relates to the field of microcontrollers. Specifically, the present invention relates to clocks used for dynamically programmable, multi-functional system-on-a-chip architectures.

BACKGROUND ART

Microcontrollers function to replace mechanical and electromechanical components in a variety of applications and devices. Since they were first introduced approximately 30 years ago, microcontrollers have evolved to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely affect the choice of microcontroller. The designer thus again faces the challenge of finding a suitable microcontroller for the intended application.

One solution to the problems described above is to design a microcontroller customized for the intended application. However, this solution may still not be practical because of the time needed to develop a custom microcontroller and the cost of doing so. In addition, should the design of the intended application be changed, it may also be necessary to change the design of the custom microcontroller, further increasing costs and lead times.

A programmable analog system architecture that is suited for a variety of applications and that can reduce development time and expenses is described in the co-pending, commonly owned U.S. patent application, Ser. No. 09/929,891, filed Aug. 14, 2001, by M. Mar et al., hereby incorporated by reference. The analog system architecture is generally referred to as a programmable analog "system-on-a-chip."

The programmable analog system architecture described in the reference introduces a set of tailored analog blocks and elements that can be configured and reconfigured in different ways to implement a variety of different analog functions. The programmable analog system architecture is integrated with a microcontroller that provides sequencing and programming instructions.

The analog blocks are arranged in an array of columns and rows on a single integrated circuit, or chip. The analog blocks can be electrically coupled to each other in different combinations to perform different analog functions. The analog functions that can be performed include, for example, an amplifier function, a digital-to-analog converter function, an analog-to-digital converter function, an analog driver function, a low band pass filter function, and a high band pass filter function.

Different combinations of analog blocks are selectively and electrically coupled depending on the analog function to be achieved. Thus, there is a need to maintain phase and frequency alignment of the clock signals used by the combination of analog blocks ("synchronized" will be used herein to refer to clock signals at the same phase and frequency). For example, a combination of analog blocks may include blocks from one column that are coupled with blocks from another column. In this case, there is a need to maintain phase and frequency alignment of the clock signals for all of the blocks in the combination of blocks regardless of the column the blocks are in.

Synchronizing clocks signals across columns of analog blocks is made more complicated because blocks from multiple columns may be used to perform one function at the same time that blocks from other columns are being used to perform a different function. For example, consider an array of analog blocks having four columns designated columns 0, 1, 2 and 3. A first function may be performed using blocks from columns 0 and 1, and a second function may also be performed in parallel using blocks from columns 2 and 3. The first and second functions may be performed using clocks signals at different frequencies. The clock signals supplied to the blocks in the first combination of blocks (that is, the blocks from columns 0 and 1) need to be aligned at a first frequency, and the blocks in the second combination of blocks (the blocks from columns 2 and 3) need to be aligned at a second frequency. In addition, the phases of the clock signals supplied to the first combination and to the second combination of analog blocks should also be aligned; that is, it is desirable that the clock signals to the first and second combination of blocks be in the same phase even though they are at different frequencies. If phase alignment is not maintained, problems can occur when analog blocks attempt to communicate with each other.

Moreover, as described in the reference, a combination of analog blocks can be dynamically changed to achieve a different analog function. For example, a new combination of analog blocks may be configured to perform a new (different) function by electrically coupling and decoupling selected blocks to and from an existing combination of blocks. The change in function may also require a change to the frequency of the clock signals being supplied to the new combination of analog blocks. As a result, some or all of the analog blocks in the new combination may be switched from one frequency of clock signals to a new frequency. Accordingly, there is also a need to establish and maintain phase and frequency alignment of the clock signals supplied to the new combination of analog blocks after the change in configuration and function, without affecting other analog blocks (or combinations of analog blocks) performing other functions at the same time.

There are other factors to consider in developing a solution to the above needs. These factors include the limited area available for placing components and for routing signals between components in devices as small as microcontrollers, and the desire to reduce costs (e.g., manufacturing costs) to the extent practical.

DISCLOSURE OF THE INVENTION

The present invention provides a method for establishing and maintaining phase and frequency alignment of the clock signals supplied to a combination of analog blocks in a dynamically programmable, multi-functional system-on-a-chip architecture. The present invention also provides a method for establishing and maintaining phase and frequency alignment between analog blocks after there is a change in configuration and function.

The present invention pertains to a method for providing clock signals to a multi-functional device comprising a plurality of analog blocks coupled in a single integrated circuit. In one embodiment, the analog blocks are organized into a plurality of segments; in one embodiment, the analog blocks are organized into a plurality of columns. The plurality of analog blocks includes a first set of analog blocks (e.g., switched capacitor blocks) that can be selectively and electrically coupled to and decoupled from other analog blocks to form a combination of analog blocks. Different analog functions are implemented by selectively and electrically coupling different combinations of the analog blocks. In accordance with the present invention, all of the analog blocks in the combination of analog blocks are supplied with "synchronized" clock signals (clock signals at the same frequency and in the same phase).

In one embodiment, a plurality of segment clock generators (hereinafter, "column clock generators") is coupled to each segment or column in the array of analog blocks. Each column clock generator receives a plurality of clock signals generated by a domain clock generator. The clock signals may be at different frequencies. The column clock generators each select a clock signal from the plurality of clock signals. In one embodiment, a multiplexer is used by each column clock generator to select the clock signal from the plurality of clock signals supplied by the domain clock generator. In another embodiment, each column clock generator selects a clock signal according to information in a memory register.

Because a combination of analog blocks can include blocks from multiple columns, there may be multiple column clock generators coupled to the combination of blocks. In this case, the column clock generators coupled to the combination of analog blocks each select the same clock signal, such that all analog blocks in the combination receive a synchronized clock signal. In the present embodiment, a two-phase non-overlapping clock signal is generated from the selected clock signal.

In the present embodiment, after the selection of a first clock signal, the selection can be changed to a second clock signal, so that different clock signals (e.g., clock signals at different frequencies) can be used as needed depending on the function to be performed. Phase alignment is re-established with other clock signals upon a change in frequencies, and phase alignment is re-established when the clock selection of one column is changed to match another column.

In summary, the present invention establishes frequency alignment between the clock signals supplied to a combination of analog blocks, even if the combination includes blocks from multiple columns and even after a change in configuration or frequency. The present invention also establishes phase alignment between analog blocks or between combinations of analog blocks, even after a change in configuration or frequency. By establishing frequency and phase alignment between analog blocks, blocks in different columns of the array of analog blocks can communicate with each other when needed without the problems that occur as a result of misalignment.

Furthermore, the solution provided by the present invention reduces costs and efficiently uses the limited area available in devices as small as microcontrollers, by limiting the number of clocks that are used and the amount of routing needed for those clocks. These and other objects and advantages of the present invention will become obvious to those of ordinary skill in the art after having read the following detailed description of the preferred embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 6C illustrates a timing diagram for clock signals generated by column clock generators after a change in analog block configuration in accordance with one embodiment of the present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "selecting," "supplying," "coupling," "receiving," "generating," "maintaining," "changing," "establishing," "initializing," or the like, refer to the actions and processes (e.g., processes 700 and 800 of FIGS. 7 and 8, respectively) of a computer system or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical and mechanical computers.

Figure 1:
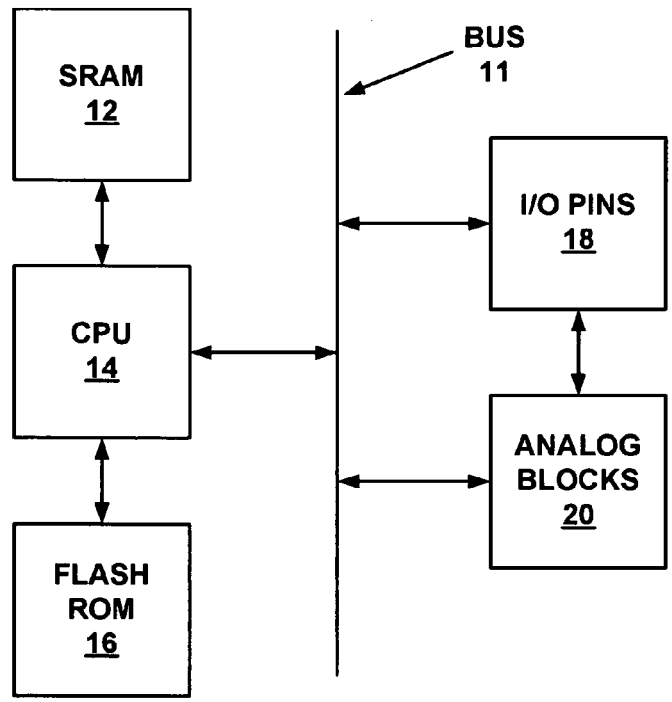
FIG. 1 is a block diagram showing an exemplary integrated circuit (or microcontroller) upon which embodiments of the present invention may be implemented.

FIG. 1 is a block diagram showing an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and analog blocks 20. The analog blocks 20 are further described below. A test interface (not shown) may be coupled to integrated circuit 10 to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely.

Analog blocks 20 are configurable system resources that can reduce the need for other microcontroller parts and external components. In the present embodiment, analog blocks 20 include an array of twelve blocks. A precision internal voltage reference provides accurate analog comparisons. A temperature sensor input is provided to the array of analog blocks to support applications like battery chargers and data acquisition without requiring external components.

In the present embodiment, two register banks are implemented on microcontroller 10, although it is appreciated that a different number of register banks (including a single bank) may alternatively be used. In one embodiment, each of the register banks contains 256 bytes. A portion of these bytes is allocated for addressing configuration registers used to configure the analog blocks 20.

In one embodiment, each of the analog blocks 20 is assigned up to four registers for programming block functions, characteristics (e.g., coefficient values) of analog elements in the analog blocks 20, and routing of inputs and outputs for the analog blocks 20. These registers may be physically located either on the analog blocks or external to the analog blocks.

In the present embodiment, there are three types of analog blocks: continuous time blocks, and two types of switched capacitor blocks (referred to herein as type A and type B). Continuous time blocks provide continuous time analog functions.

Switched capacitor blocks provide discrete time analog functions such as analog-to-digital conversion (ADC) and digital-to-analog conversion (DAC) functions. Accordingly, switched capacitor blocks require a two-phase non-overlapping clock signal. The key difference between the type A and type B switched capacitor blocks is in generating biquad filters. Both type A and type B blocks can implement basic switched capacitor functions (outside of filters), and the type A block can also function as a summing amplifier.

Analog functions supported by microcontroller 10 integrated with analog blocks 20 include, but are not limited to: 14-bit multi-slope and 12-bit delta-sigma ADC, successive approximation ADCs up to nine bits, DACs up to nine bits, programmable gain stages, sample and hold circuits, filters (high band pass and low band pass) with programmable coefficients, amplifiers, differential comparators, and temperature sensors.

Figure 2:
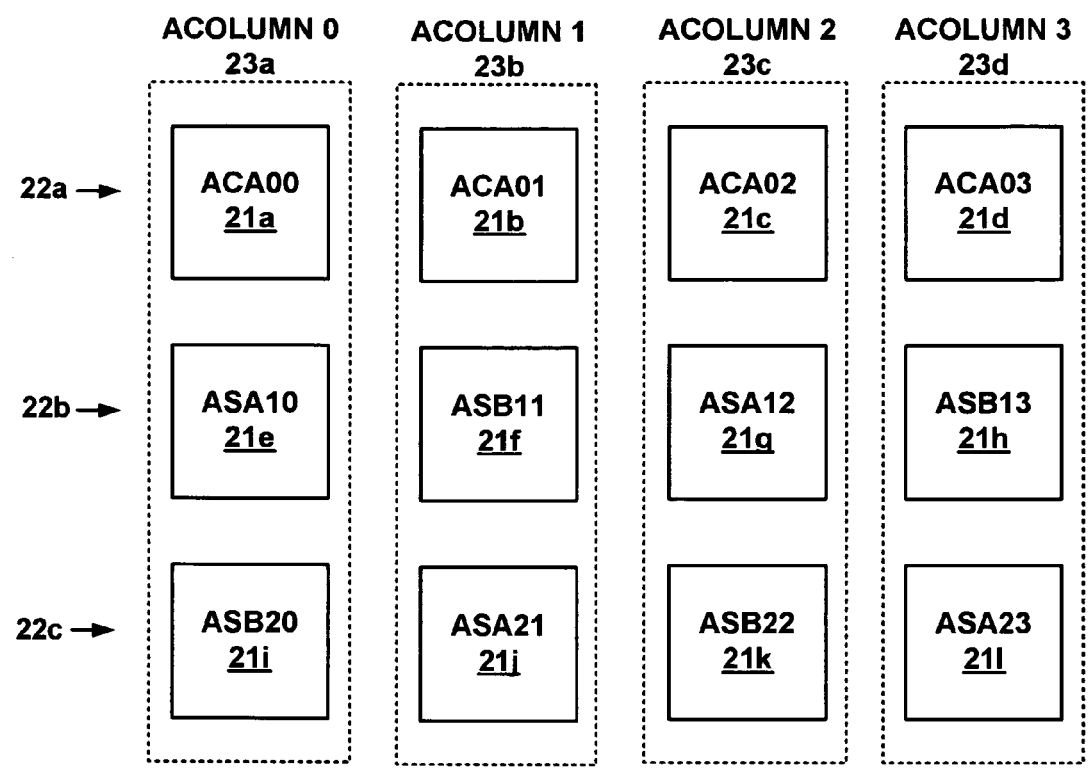
FIG. 2 shows an array of analog blocks in accordance with one embodiment of the present invention.

FIG. 2 shows an array of analog blocks 20 in accordance with one embodiment of the present invention. In this embodiment, there are twelve analog blocks 21a–21l arranged in an array of three rows 22a–22c by four columns 23a–23d. Although the analog blocks 20 are shown as arranged in columns and rows, other configurations may be used with the present invention.

In the present embodiment, each column 23a–23d includes one of each type of analog block, e.g., a continuous time block 21a–21d (designated "ACAxx"); a type A switched capacitor block 21e, 21g, 21j and 21l (designated "ASAxx"); and a type B switched capacitor block 21f, 21h, 21i, and 21k (designated "ASBxx"). Note that, in this embodiment, the type A and type B switched capacitor blocks in rows 22b and 22c are arranged in an alternating, or checkerboard, pattern.

In the present embodiment, the analog blocks 21a–21l can be powered down individually to different power levels, so that it is not necessary for all of the blocks to be running at full power. In one embodiment, the analog blocks 21a–21l have four power levels.

Figure 3:
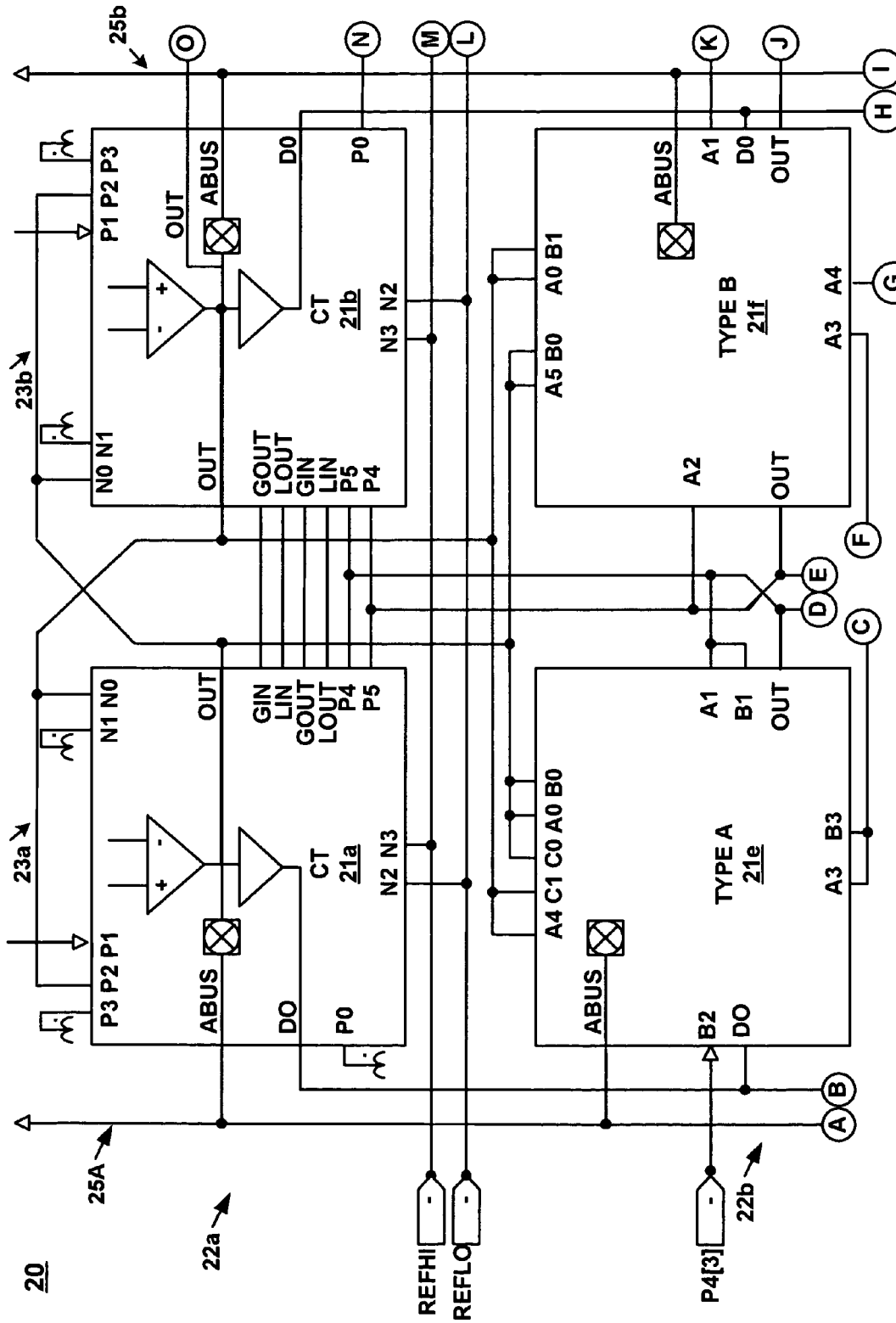
FIG. 3 shows the interconnects between analog blocks in an array in accordance with one embodiment of the present invention.
Figure 3:
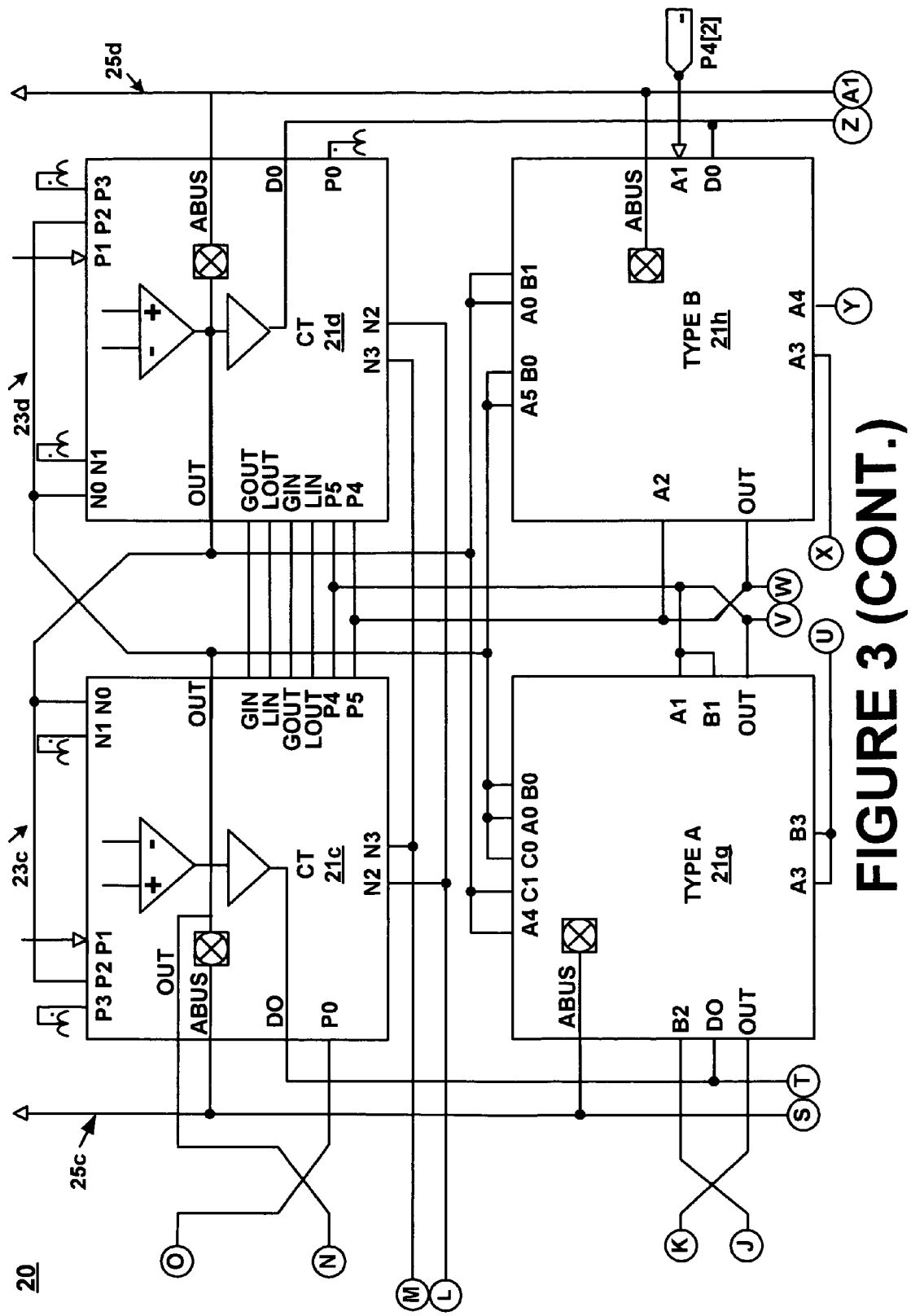
Figure 3:
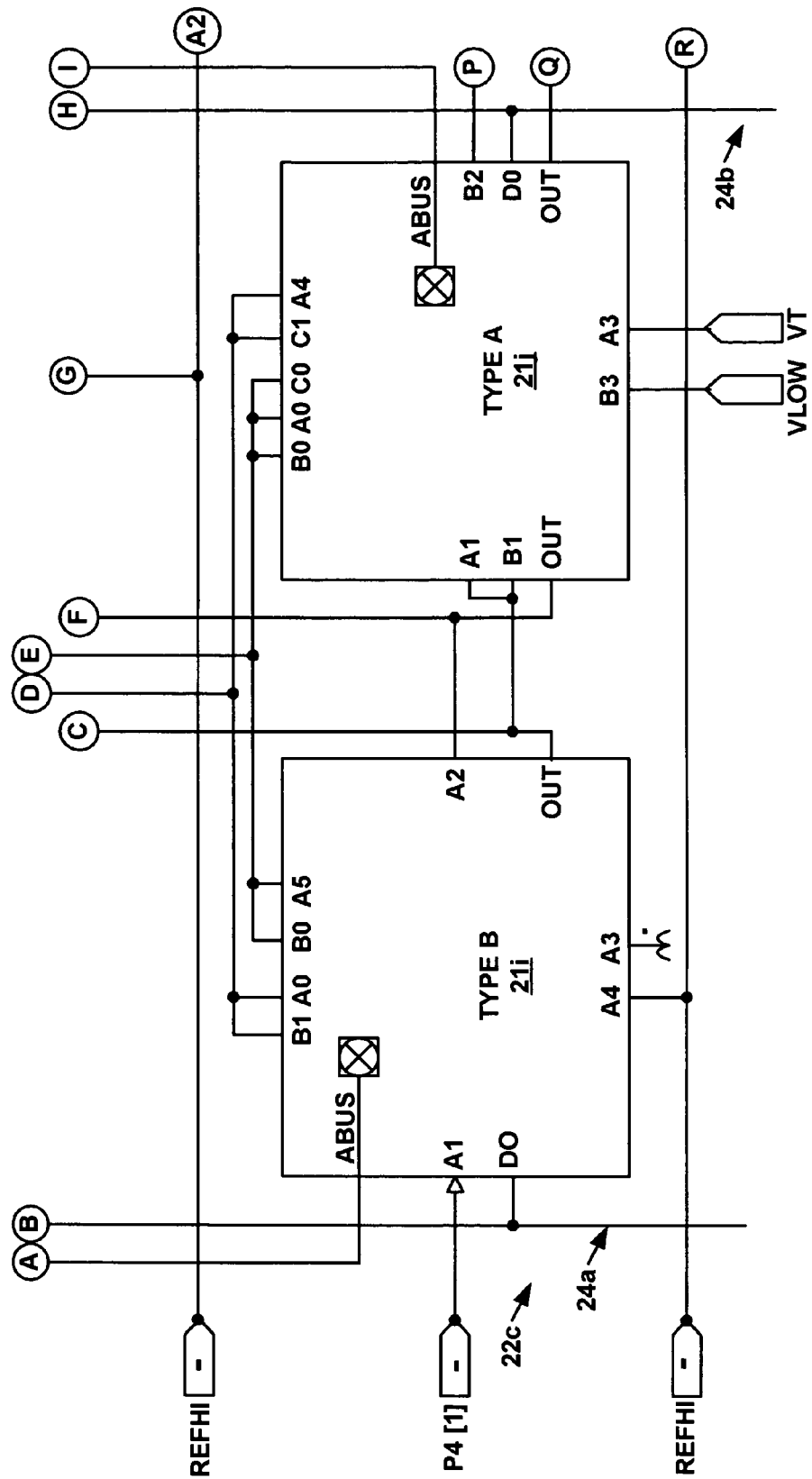
Figure 3:
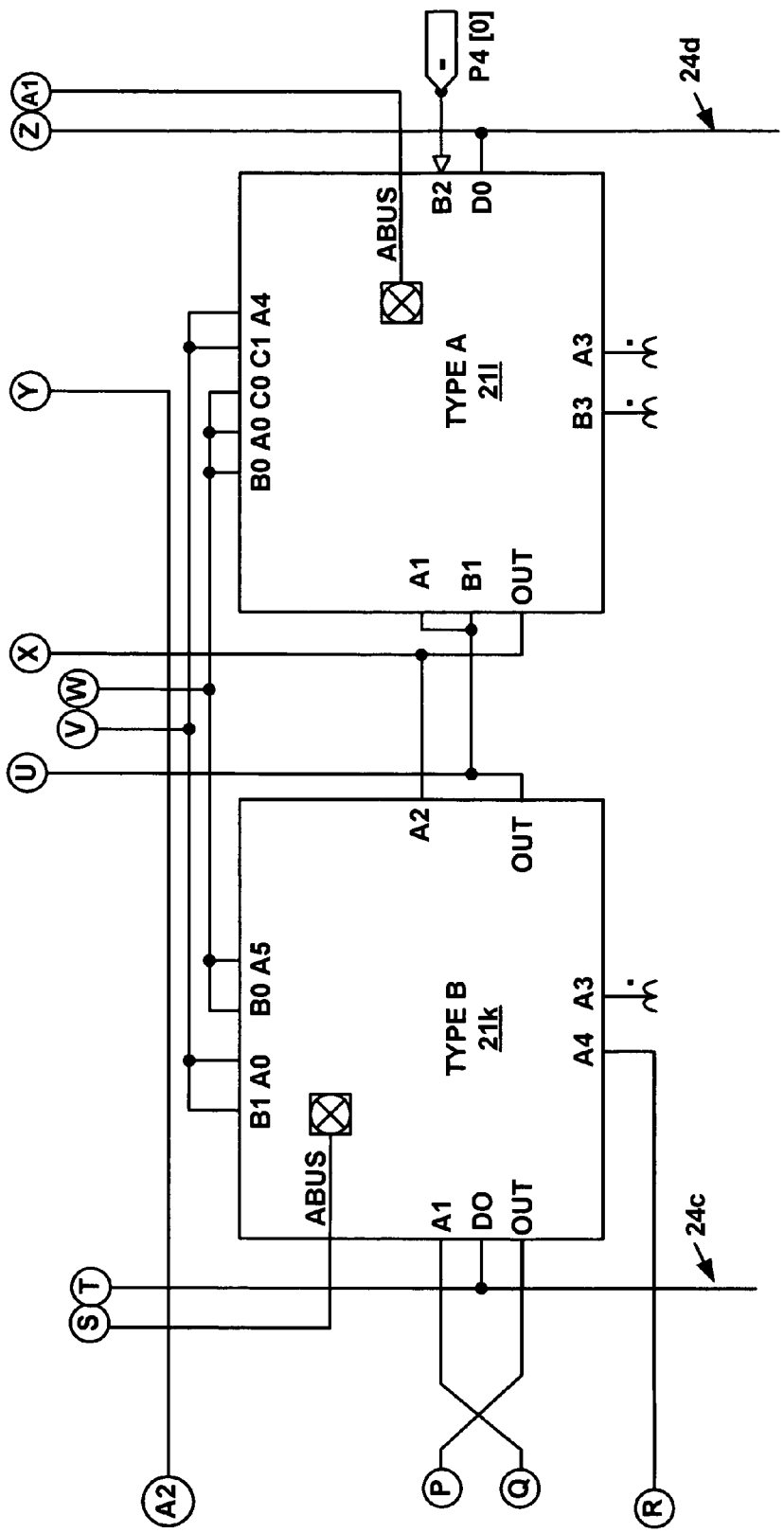

FIG. 3 shows the interconnects between analog blocks 20 in an array in accordance with one embodiment of the present invention. In this embodiment, each analog block 21a–21l is interconnected with its adjacent (e.g., nearest neighbor) analog block. Note that, although the analog blocks 21a–21l are interconnected, they may not be electrically coupled. The distinction between being connected and being electrically coupled is important because the analog functions performed by the analog blocks 20 are implemented by enabling certain analog blocks of the circuit and bypassing others according to user programming. That is, certain analog blocks in the array of analog blocks 20 are selectively and electrically coupled to other analog blocks according to the function to be performed. The analog functions are also implemented by setting characteristics of passive elements (e.g., capacitors and resistors) within each of the analog blocks 20.

In accordance with the present invention, different combinations of analog blocks 20 can be selected according to the user programming in order to perform different functions. In one embodiment, individual analog blocks can be enabled and bypassed, respectively, by enabling and closing appropriate switches in response to the programming. Signals are thereby routed through the analog blocks 20 by enabling and closing programmable switches, so that the signals are routed to the analog blocks necessary to accomplish the particular analog function selected. Mechanisms other than switches may be used to enable and bypass analog blocks.

In the present embodiment, for each column 23a–23d, there is a respective digital bus 24a–24d and a respective analog bus 25a–25d coupled to each analog block in the column. Any analog block on these buses can have its output enabled to drive the buses. The analog buses 25a–25d are each a gated operational amplifier output. The digital buses 24a–24d are each a comparator output derived by buffering the operational amplifier (op-amp) output through an inverter. In one embodiment, reference buses (not shown) are also provided to provide a reference voltage for ADC and DAC functions.

The continuous time blocks 21a–21d can be programmed to serve as a first-order isolation buffer, if necessary. In that case, data essentially flow through the array of analog blocks 20 from top to bottom (e.g., from row 22a to row 22c). However, if the signals do not need to be buffered, then the signals can arrive directly at a switched capacitor block in one row (e.g., row 22c), then be switched to another row (e.g., row 22b).

Output signals from each analog block include DO and those signals that include "out" in their designation (such as OUT, GOUT, and LOUT). Signals labeled otherwise are input signals to a block.

Additional information regarding the programmable analog block architecture of the present invention is provided in the co-pending, commonly owned U.S. patent application Ser. No. 09/929,891, filed Aug. 14, 2001, by M. Mar et al., hereby incorporated by reference.

Figure 4:
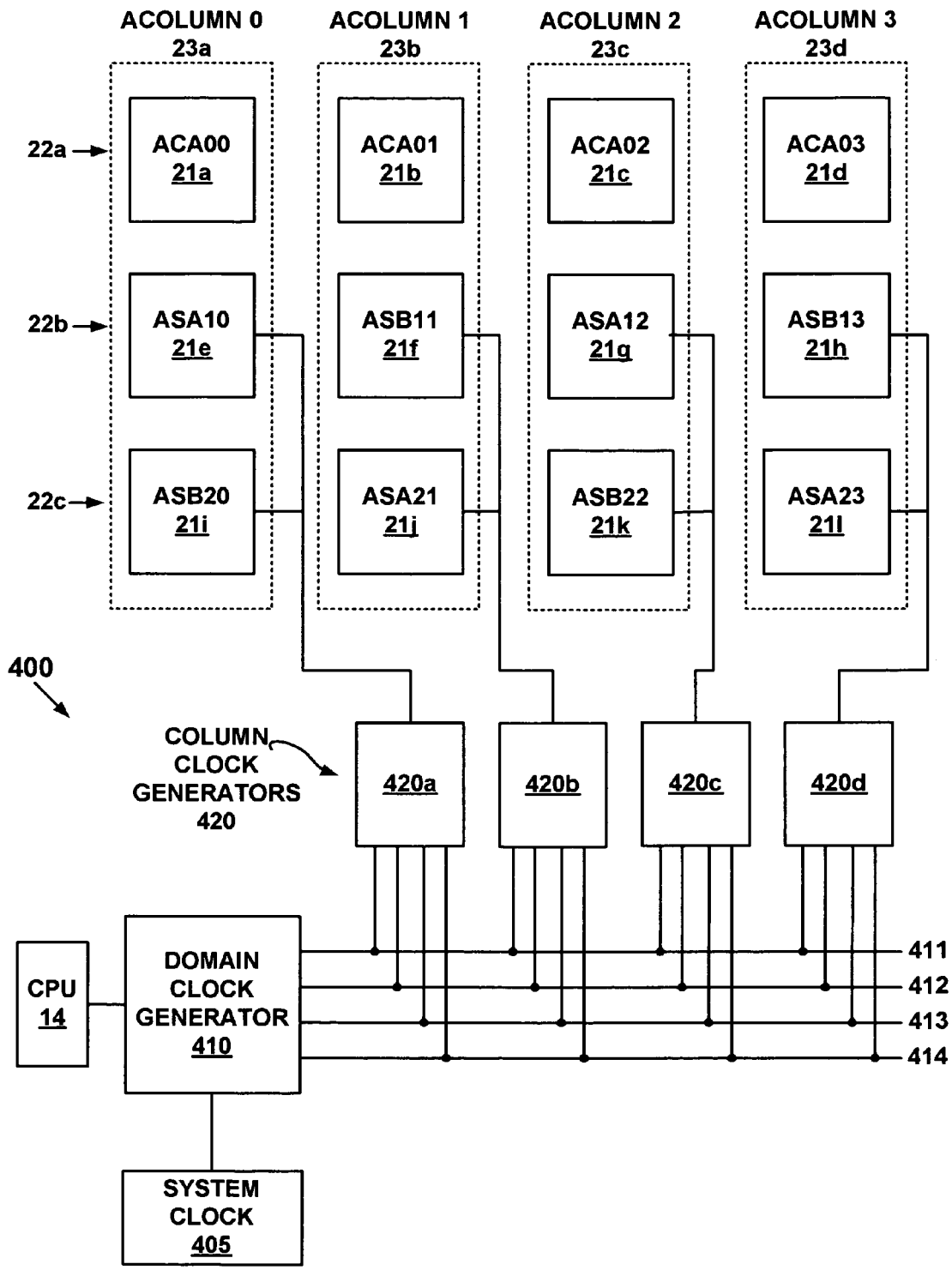
FIG. 4 is a block diagram showing a circuit for synchronizing clock signals supplied to an array of analog blocks in accordance with one embodiment of the present invention.

FIG. 4 is a block diagram showing a circuit 400 for synchronizing clock signals supplied to an array of analog blocks 20 in accordance with one embodiment of the present invention. In this embodiment, circuit 400 includes domain clock generator 410 and column clock generators 420a, 420b, 420c and 420d.

Generally, the analog blocks 20 are organized into a plurality of segments, with a clock generator (e.g., a segment clock generator) coupled to each segment. Specifically, in one embodiment, a plurality of column clock generators 420a, 420b, 420c and 420d are coupled to columns 23a, 23b, 23c and 23d, respectively. Although in this embodiment a segment corresponds to a column of analog blocks, it is appreciated that the analog blocks may be organized into different types of segments, with a segment clock generator coupled to each of these segments. For clarity and brevity of discussion, the present invention is described in the context of columns of analog blocks coupled to column clock generators.

In the present embodiment, column clock generators 420a, 420b, 420c and 420d are coupled to the switched capacitor blocks in the respective columns 23a, 23b, 23c and 23d. For example, column clock generator 420a is coupled to switched capacitor blocks 21e and 21i. As described above, switched capacitor blocks 21e–21l require a two-phase non-overlapping clock signal for discrete time functions. The column clock generators 420a–420d may also be used for continuous time blocks; for example, a switched capacitor block may be coupled to a continuous time block that is operating as a comparator. In that case, the output on the digital comparator bus for a column is synchronized to the function running in that column.

In the present embodiment, column clock generators 420a, 420b, 420c and 420d are also coupled to domain clock generator 410. Domain clock generator 410 operates under control of CPU 14 of microcontroller 10 (FIG. 1). Domain clock generator 410 is also coupled to system clock 405.

Continuing with reference to FIG. 4, system clock generator 405 is a main source of clock signal generation. In one embodiment, system clock generator 405 provides a 24 Mhz signal from a precision integrated circuit oscillator. This clock signal can be divided down by domain clock generator 410 into a plurality of different single-ended clock signal frequencies. For example, domain clock generator 410 may generate up to eight (8) different single-ended clock signal frequencies based on the clock signal supplied by system clock generator 405. All of or a portion of the single-ended clock signals that can be generated by domain clock generator 410 may be output to the column clock generators 420a–420d. In one embodiment, four (4) clock signals are generated by domain clock generator 410, and these 4 signals are output to each of the column clock generators 420a–420d on lines 411, 412, 413 and 414, respectively.

Each of the column clock generators 420a–420d then selects one of the clock signals supplied from domain clock generator 410, and supplies the selected clock signal to the respective column 23a–23d (specifically, to the respective switched capacitor blocks 21e–21l). It is appreciated that the column clock generators 420a–420d may each select different clock signals, or that one or more of the column clock generators 420a–420d may select the same clock signal.

Figure 5A:
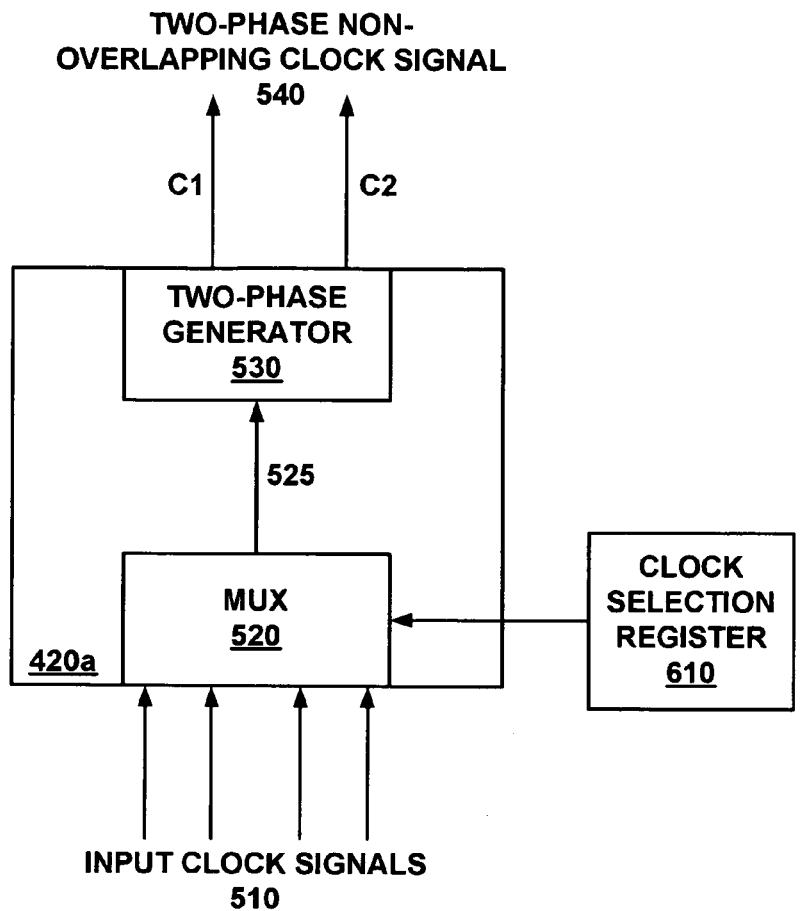
FIG. 5A is a block diagram showing a column clock generator in accordance with one embodiment of the present invention.

FIG. 5A is a block diagram showing an exemplary column clock generator 420a in accordance with one embodiment of the present invention. In this embodiment, column clock generator includes a multiplexer (MUX) 520 and a two-phase signal generator 530.

In the present embodiment, column clock generator 420a receives a plurality of single-ended input clock signals 510 from domain clock generator 410 (FIG. 4). Column clock generator 420a selects one of the input clock signals 510 (e.g., clock signal 525) using MUX 520. In one embodiment, MUX 520 selects clock signal 525 according to information in a clock selection register 610. Two-phase generator 530 then generates a two-phase non-overlapping clock signal 540 (C1 and C2) from clock signal 525 using a known technique.

It is appreciated that the two-phase generator may be external to column clock generator 420a, receiving clock signal 525 as input from MUX 520. It is also appreciated that input clock signals 510 may already be two-phase signals (although at different frequencies); for example, domain clock generator 410 may generate two-phase signals from the signals it receives from system clock 405. In this latter case, column clock generator 420a would not need to include two-phase generator 530; however, relative to the embodiments illustrated by FIGS. 4 and 5A, additional routing from domain clock generator 410 to the column clock generators 420a–420d may be needed. In any case, in the present embodiment, a two-phase non-overlapping clock signal 540 is supplied by column clock generator 420a to switched capacitor blocks 21e and 21i of FIG. 4.

Figure 5B:
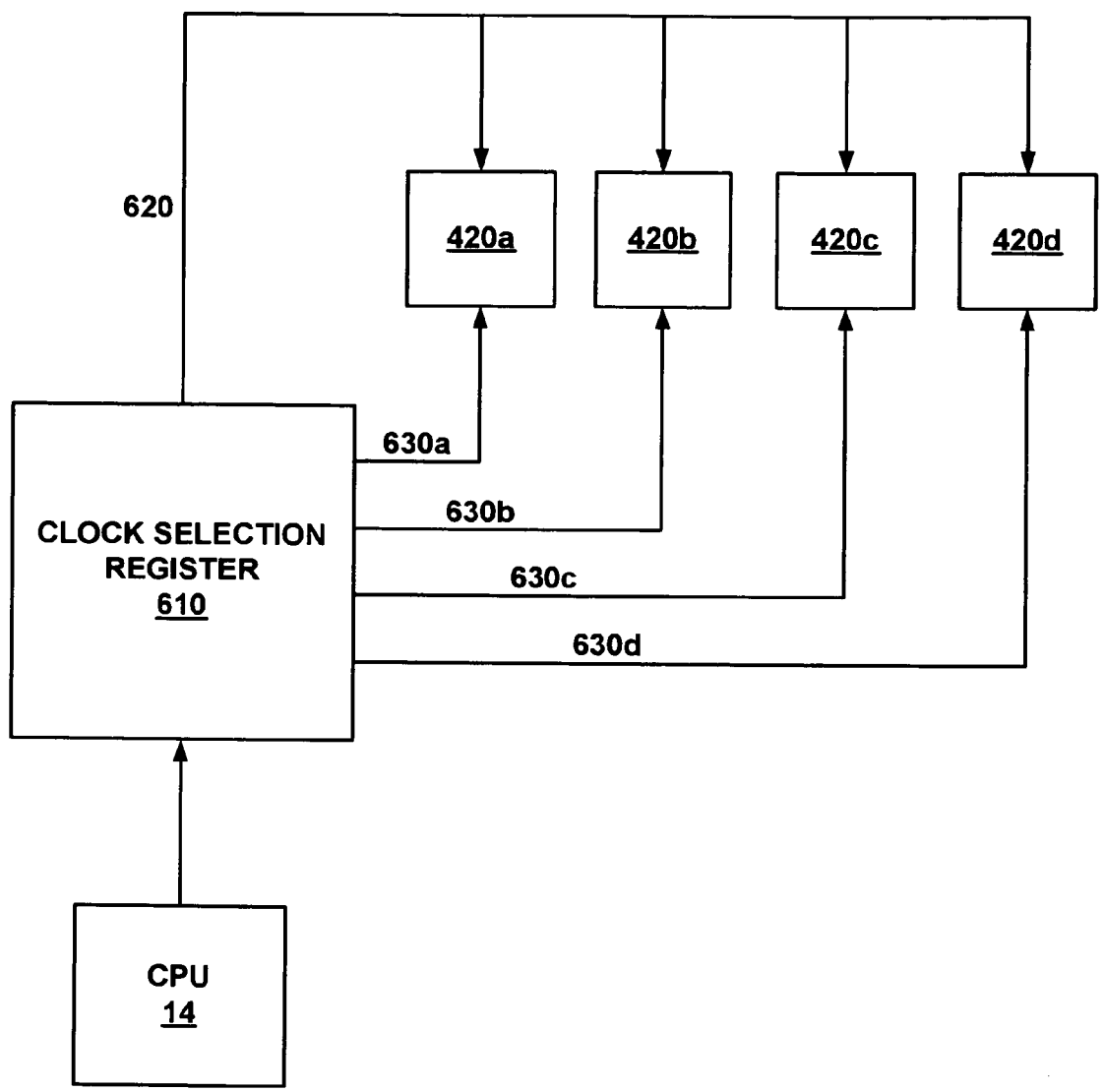
FIG. 5B is a block diagram showing a clock selection register in accordance with one embodiment of the present invention.

FIG. 5B is a block diagram showing a clock selection register 610 in accordance with one embodiment of the present invention. Clock selection register 610 provides clock synchronization ("sync") signal 620 and clock select signals 630a–630d to column clock generators 420a–420d along arbitrary width lines. In one embodiment, clock sync signal 620 is a one-bit control signal, and clock select signals 630a–630d are each two-bit signals.

In the present embodiment, clock sync signal 620 is used for a synchronous reset of the column clock generators 420a–420d (that is, clock sync signal 620 can be used to "flush" the column clock generators). The synchronous reset sets the column clocks 420a–420d to a known (specified) state. The synchronous reset can be performed to set the column clocks 420a–420d to an initial set of clock signal frequencies when the microcontroller 10 (FIG. 1) is powered on, or to set the column clocks 420a–420d to a known state at some other time after power on, for example when a new (different) function is dynamically implemented.

With reference to FIG. 5B, in the present embodiment, all of the column clock generators 420a–420d are coupled to a single clock selection register 610. In one embodiment, clock selection register 610 is an eight-bit register, with two bits per column, to select one of the four clocks for each column. It is appreciated that, in another embodiment, the column clock generators 420a–420d are each coupled to a respective clock selection register. In this latter embodiment, each of the clock selection registers is a two-bit register.

Column clock register 610 includes information indicating which of the clock signals (e.g., input clock signals 510 of FIG. 5A) should be selected by each column clock generator 420a–420d. That is, the values of the bits in clock selection register 610 are used to specify which clock signal should be selected by which column clock generator. In the present embodiment, the lines 630a–630d are used to communicate this information (e.g., the bit values) to each column clock generator 420a–420d. Based on the information in column clock register 610, each column clock generator 420a–420d selects one of the input clock signals 510.

Continuing with reference to FIG. 5B, the information in column clock register 610 can be dynamically changed. Changing the information in column clock register 610 causes one or more of the column clock generators 420a–420d to select a different clock signal from the input clock signals 510 (FIG. 5A).

Figure 5C:
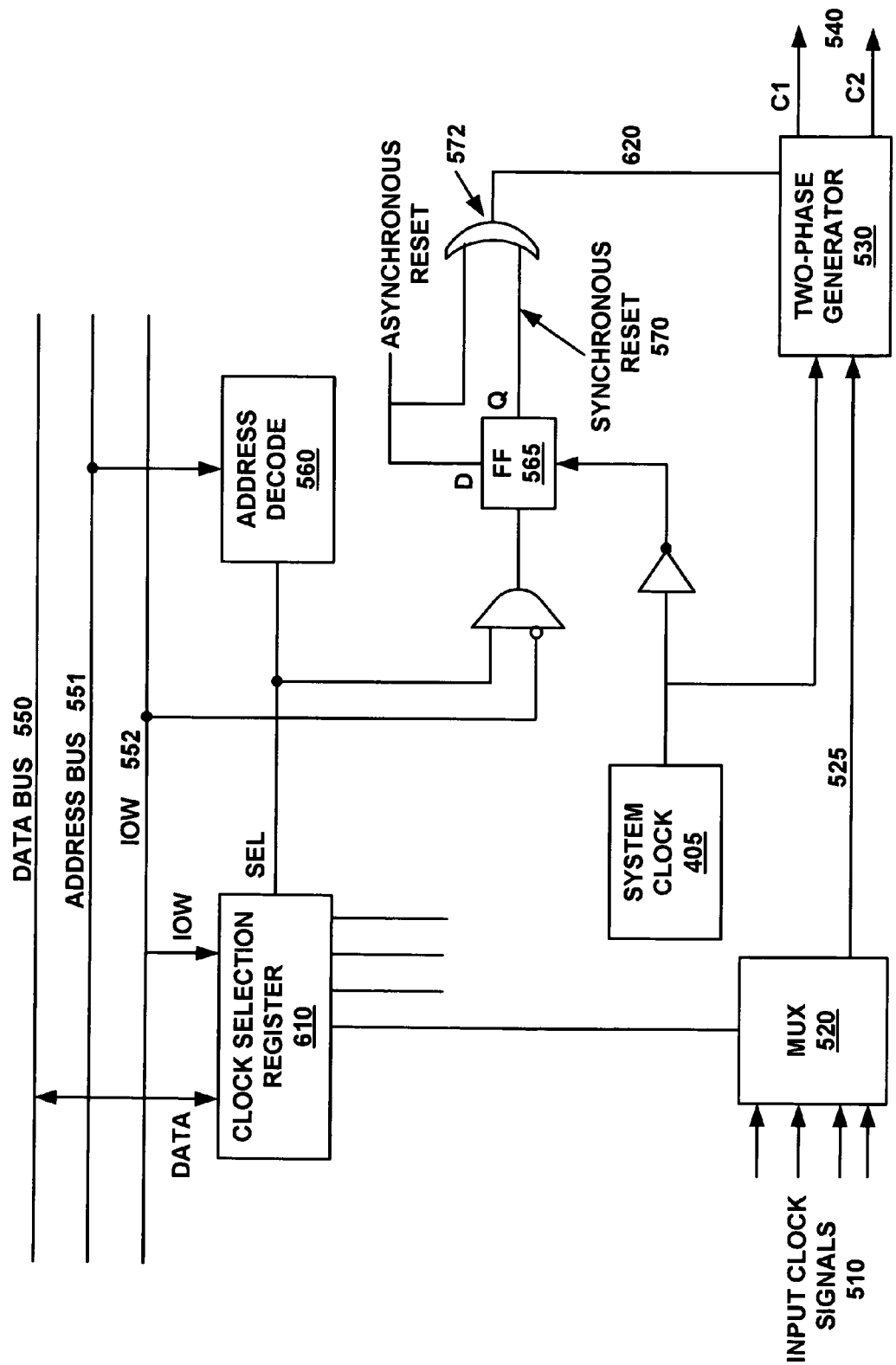
FIG. 5C is a block diagram providing additional details of the column clock generator of FIG. 5A in accordance with one embodiment of the present invention.

FIG. 5C is a block diagram providing additional details of a column clock generator (e.g., column clock generator 420a of FIG. 5A) in accordance with one embodiment of the present invention. In this embodiment, clock selection register 610 is coupled to a data bus 550 and an input/output-write (IOW) bus 552. Clock selection register 610 is also coupled to address decode block 560, which is in turn coupled to an address bus 551. It is appreciated that there may be other buses in addition to an address bus, a data bus and an IOW bus.

Referring to FIG. 5C, in the present embodiment, when both IOW and SEL are "high," then a synchronous reset (570) is triggered and flip-flop (FF) 565 samples system clock 405. IOW and SEL may both be high in response to a change in configuration of the analog blocks, for example. In one embodiment, an asynchronous reset (e.g., a manual reset) can be separately triggered, in response to action by a user, for example. In response to either a synchronous or an asynchronous reset, OR gate 572 generates clock sync signal 620. The two-phase non-overlapping clock signal 540 generated by the column clock generator 420a is reset (initialized) to a known state in response to clock sync signal 620.

In a similar manner, the clock signals generated by other column clock generators (e.g., column clock generators 420b–420d of FIG. 4) are also reset to the known state, so that phase alignment is re-established with other clock signals upon a change in configuration. In the present embodiment, each of the clock signals are reset to the known state, even the clock signals for those combinations of analog blocks not affected by the change in configuration. This approach can be accomplished using a single clock sync signal, and thus simplifies the logic needed to implement the present invention while reducing the area that would be consumed by lines needed for additional sync signals. However, it is appreciated that, in an alternative implementation, additional logic and lines can be used to implement additional clock sync signals, so that clock signals to one combination of analog blocks can be changed and synchronized without affecting the clock signals to another combination of analog blocks.

Figure 6A:
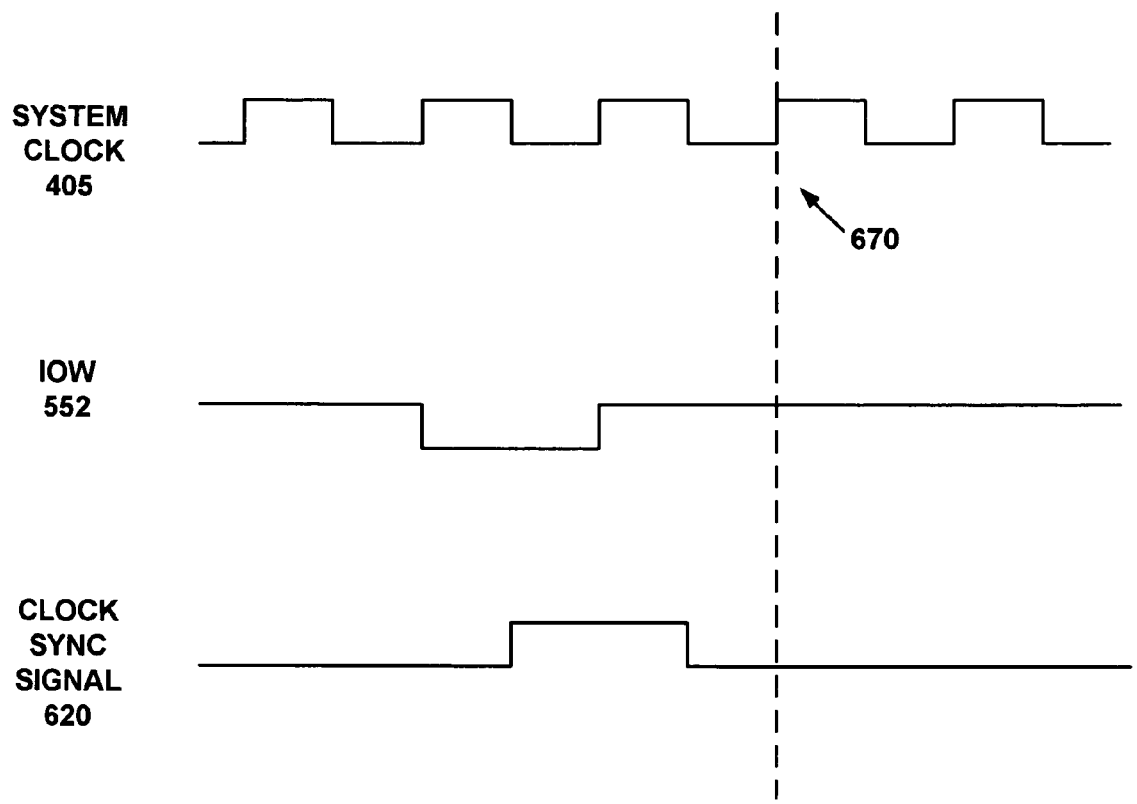
FIG. 6A illustrates a timing diagram for input signals to a column clock generator in accordance with one embodiment of the present invention.

FIG. 6A illustrates a timing diagram for a set of input signals to a column clock generator (e.g., column clock generator 420a of FIG. 5A) in accordance with one embodiment of the present invention. With IOW (552) and SEL (not shown) high, clock sync signal 620 is generated as described above. In accordance with the present embodiment of the present invention, two-phase clock signal generation is re-established in an initialized state on the next edge (670) of a pulse generated by system clock 405.

Figure 6B:
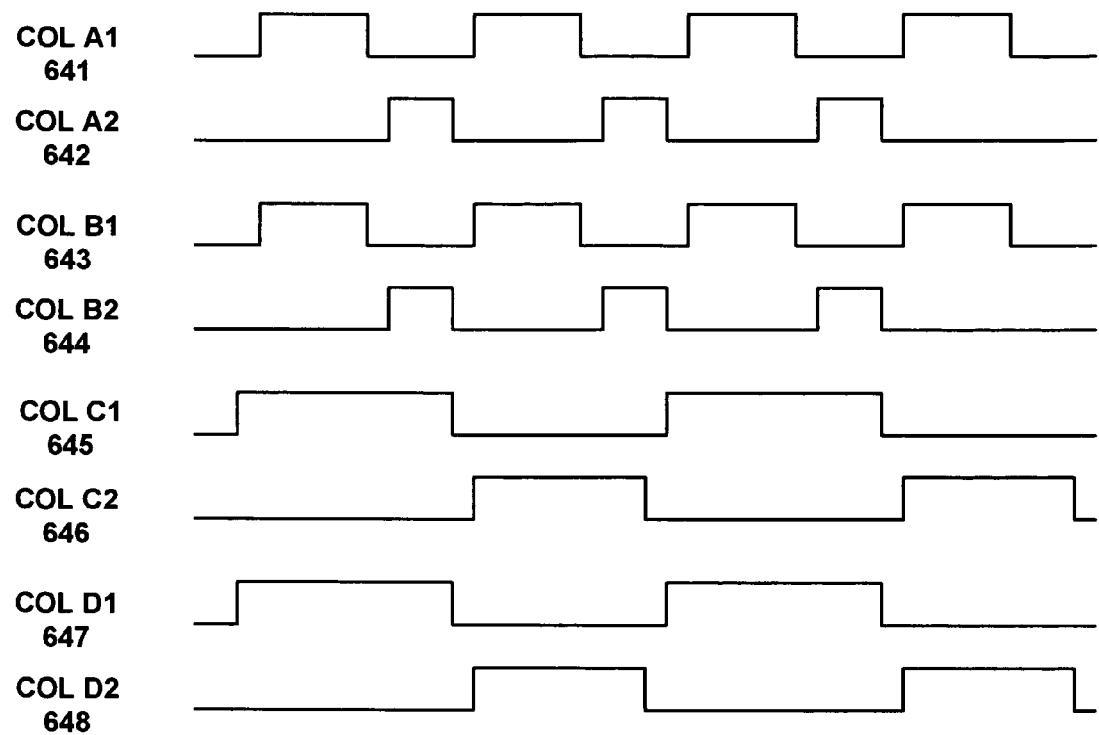
FIG. 6B illustrates a timing diagram for clock signals generated by column clock generators in accordance with one embodiment of the present invention.

FIG. 6B illustrates a timing diagram for two-phase non-overlapping clock signals generated by four column clock generators in accordance with one embodiment of the present invention. For example, COLA1 641 and COLA2 642 are generated by column clock generator 420a, COLB1 643 and COLB2 644 are generated by column clock generator 420b, COLC1 645 and COLC2 646 are generated by column clock generator 420c, and COLD1 647 and COLD2 648 are generated by column clock generator 420d. In this example, columns A and B (e.g., columns 23a and 23b of FIG. 4) are electrically coupled to perform a function, and columns C and D (e.g., columns 23c and 23d of FIG. 4) are electrically coupled to perform a function. Accordingly, COLA1 641 and COLA2 642 and COLB1 643 and COLB2 644 are synchronized at a first phase and frequency, while COLC1 645 and COLC2 646 and COLD1 647 and COLD2 648 are also synchronized but at a phase and frequency different from the first.

FIG. 6C illustrates a timing diagram for clock signals generated by column clock generators after a change in analog block configuration (occurring at 680) in accordance with one embodiment of the present invention. In the initial configuration, as described in conjunction with FIG. 6B, columns A and B (e.g., columns 23a and 23b of FIG. 4) are electrically coupled to perform a function, and columns C and D (e.g., columns 23c and 23d of FIG. 4) are electrically coupled to perform a function. After the change in configuration, columns A and D are electrically coupled to perform a function, and columns B and C are electrically coupled to perform a function. In accordance with the present embodiment of the present invention, COLA1 641 and COLA2 642 and COLD1 647 and COLD2 648 are synchronized at one phase and frequency, and COLB1 643 and COLB2 644 and COLC1 645 and COLC2 646 are also synchronized but at a different phase and frequency.

Figure 7:
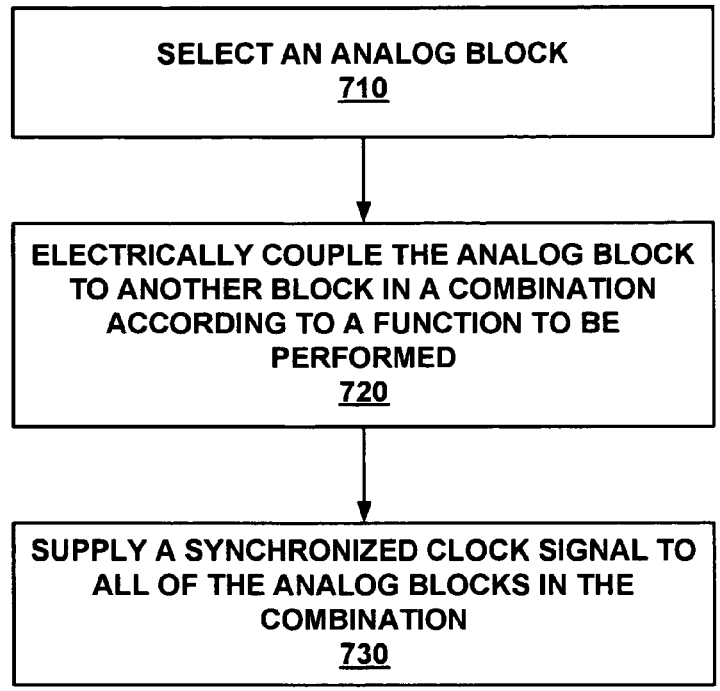
FIG. 7 is a flowchart of the steps in a process for providing clock signals to a multi-functional device in accordance with one embodiment of the present invention.

FIG. 7 is a flowchart of the steps in a process 700 for providing clock signals to a multi-functional device (e.g., integrated circuit 10 of FIG. 1) in accordance with one embodiment of the present invention. As described above, integrated circuit 10 includes a plurality of analog blocks 20 (FIGS. 2 and 3) that can be electrically coupled in different combinations to perform different functions. Although specific steps are disclosed in process 700 of FIG. 7, such steps are exemplary. That is, the present invention is well suited to performing various other steps or variations of the steps recited in process 700. It is appreciated that the steps in process 700 may be performed in an order different than presented, and that not all of the steps in process 700 may be performed.

In step 710 of FIG. 7, according to the user's programming, an analog block is selected from analog blocks 20 (FIGS. 2 and 3).

In step 720 of FIG. 7, the selected analog block is selectively and electrically coupled to one or more of the other analog blocks 20, to form a combination of blocks dependent on the particular analog function to be implemented and according to the user's programming. Certain analog blocks may be bypassed (not used) in the resultant circuit. Characteristics of elements in the analog blocks 20 can also be specified according to the user's programming, also depending on the particular analog function to be implemented.

In step 730, in accordance with the present invention, all of the analog blocks in the combination of blocks are supplied with a synchronized clock signal. A combination of analog blocks can include blocks from multiple columns of analog blocks 20 (FIGS. 2 and 3); however, in accordance with the present invention, all analog blocks in the combination receive a synchronized clock signal. Additional information is provided below.

Figure 8:
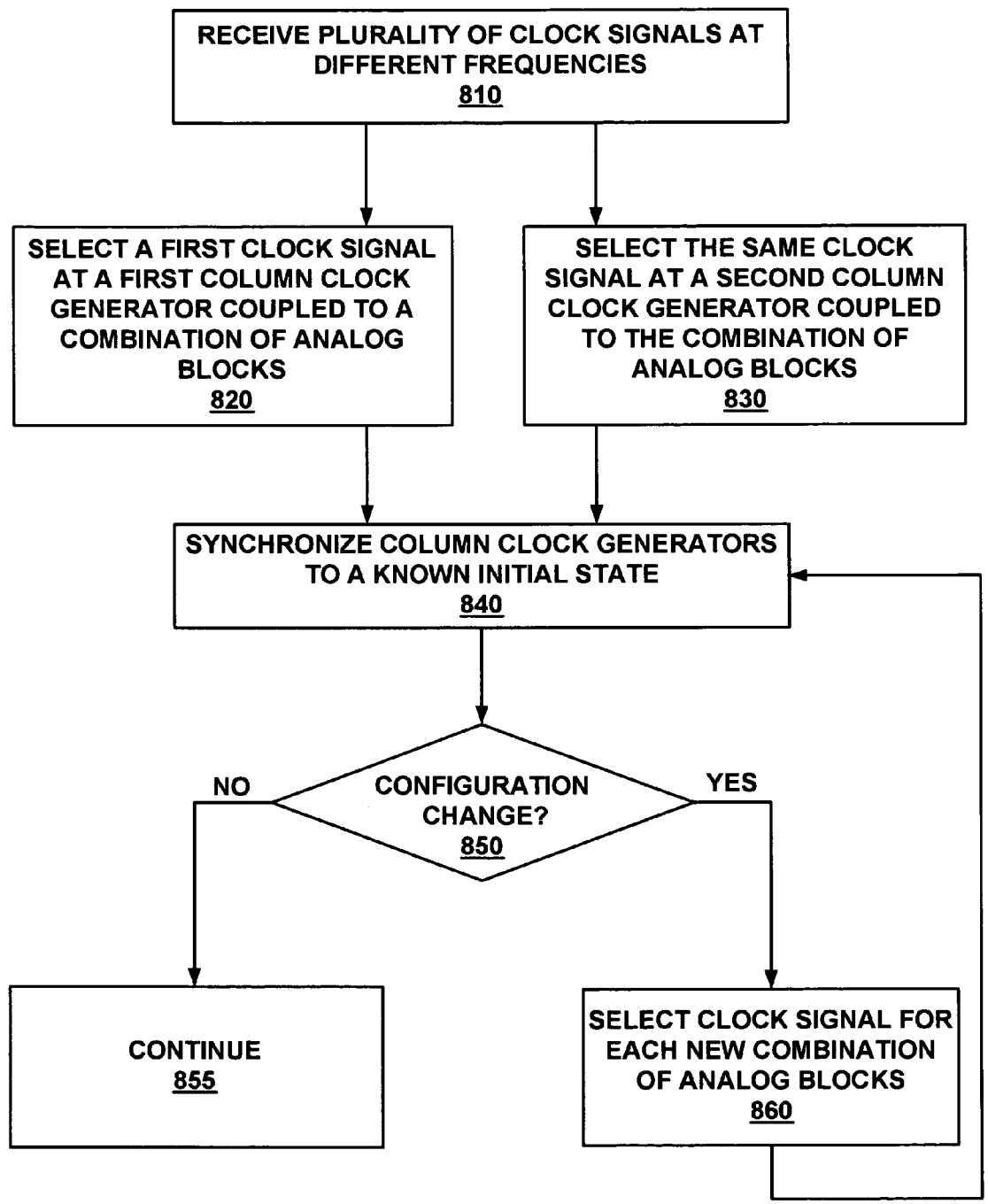
FIG. 8 is a flowchart of the steps in a process for synchronizing clock signals in a multi-functional device in accordance with one embodiment of the present invention.

FIG. 8 is a flowchart of the steps in a process 800 for synchronizing clock signals in a multi-functional device (e.g., integrated circuit 10 of FIG. 1) in accordance with one embodiment of the present invention. Although specific steps are disclosed in process 800 of FIG. 8, such steps are exemplary. That is, the present invention is well suited to performing various other steps or variations of the steps recited in process 800. It is appreciated that the steps in process 800 may be performed in an order different than presented, and that not all of the steps in process 800 may be performed.

In step 810, the column clock generators 420a–420d receive a plurality of clock signals from domain clock generator 410 (FIG. 4). The clock signals can have different frequencies. In one embodiment, four clock signals are received by each column clock generator 420a–420d.

As described above, combinations of analog blocks are formed according to the particular analog function to be achieved. A combination of analog blocks can include blocks from multiple columns of analog blocks 20 (FIGS. 2 and 3). In this case, multiple column clock generators may be coupled with the combination of analog blocks. For example, a combination of analog blocks that includes blocks from columns 23a and 23b would be coupled with column clock generators 420a and 420b (FIG. 4).

In steps 820 and 830 of FIG. 8, continuing with the example from the preceding paragraph, each of the column clock generators coupled to the combination of analog blocks (e.g., column clock generators 420a and 420b) selects the same clock signal and generates a two-phase non-overlapping clock signal.

In step 840, each of the column clock generators synchronizes their respective two-phase non-overlapping clock signals to a known initial state.

In step 850, a change in configuration may occur. If there is no change in configuration, then the circuit/device continues to function as before (step 855). If there is a change in configuration, then a clock signal is selected for each new combination of analog blocks as described above (step 860). In the present embodiment, after step 869, process 800 returns to step 840, in which the column clock generators each synchronize their respective clock signals.

Thus, in accordance with the present invention, all of the analog blocks in the combination of analog blocks receive the same clock signal regardless of which column (e.g., column 23a or 23b) the analog block is in.

Processes 700 and 800 (FIGS. 7 and 8, respectively) used by the various embodiments of the present invention are further described in conjunction with FIGS. 4, 5A and 5B. The case in which a combination of analog blocks extends across more than one of the columns 23a–23d is of particular interest, because in that case it is necessary to establish and maintain synchronous clock signals (that is, clock signals with the same frequency and in phase) across multiple columns. In addition, as will be seen, that case encompasses the simpler case in which a combination of analog blocks includes only analog blocks from a single column. Also, for purposes of clarity and brevity, the present invention is described in the context of a single analog function being performed by analog blocks 20; however, it is understood that multiple functions may be performed by analog blocks 20 in parallel.

With reference to FIGS. 4, 5A and 5B, consider an exemplary (first) function performed using a combination of analog blocks from columns 23a and 23b, specifically, continuous time blocks 21a and 21b and switched capacitor blocks 21e and 21f. Column clock generators 420a and 420b are coupled to columns 23a and 23b, respectively. When microcontroller 10 (FIG. 1) is powered on, clock selection register 610 is initialized (written) with information describing which of the clock signals the column clock generators 420a and 420b should select in order to achieve the desired (first) function. In this example, because analog blocks are being used from both columns 23a and 23b, the information in clock selection register 610 directs column clock generators 420a and 420b to select the same input clock signal. At the same time, analog blocks in columns 23c and 23d may be performing a different function. Accordingly, clock selection register 610 can independently direct column clock generators 420c and 420d to select a particular input clock signal.

Continuing with reference to FIGS. 4, 5A and 5B, column clock generators 420a and 420b each select the clock signals on line 411 (for example) based on the information written to clock selection register 610. The column clock generators 420a and 420b each generate a two-phase non-overlapping clock signal 540 from the selected clock signal. In this manner, all of the analog blocks in the combination of analog blocks performing the first function will receive clock signals that have the same frequency and that are in phase.

Operation according to the first function continues until a change in function is necessary or desired. For example, a two-way communication device may require digital-to-analog conversion (DAC) when receiving and analog-to-digital conversion (ADC) when transmitting. As described further in the application referenced above, these functions can be performed by electrically coupling selected analog blocks 20; however, the change in function may require that a different combination of analog blocks 20 be used. The change in function may also require that clock signals at a different frequency be used. In accordance with the present invention, the combination of analog blocks 20 can be changed and/or the frequency of the clock signals can be changed while establishing frequency and phase alignment of the clock signals supplied to the new combination of analog blocks, even when the new combination extends across multiple columns of analog blocks.

Consider the case in which the new (second) function requires a different combination of analog blocks and a different clock signal frequency. For example, in order to achieve the second function, continuous time block 21b and switched capacitor block 21f are electrically decoupled from the existing combination, and continuous time block 21c and switched capacitor block 21g are electrically coupled to the existing combination. As such, the combination of analog blocks includes blocks from columns 23a and 23c served by column clock generators 420a and 420c. The method for dynamically reconfiguring analog blocks 20 to perform a selected analog function is described further in the co-pending, commonly owned U.S. patent application Ser. No. 09/930,021, filed Aug. 14, 2001, by M. Mar et al., and entitled "Programming Methodology and Architecture for a Programmable Analog System," hereby incorporated by reference.

In accordance with the present invention, new information is written to clock selection register 610 to direct column clock generators 420a and 420c to select particular clock signals for the new (different) analog function. For example, column clock generators 420a and 420c select the clock signals on line 412 based on the information written to clock selection register 610. As above, the column clock generators 420a and 420c each generate a two-phase non-overlapping clock signal 540 from the selected clock signal. In this manner, all of the analog blocks in the new combination of analog blocks will continue to receive clock signals that have the same frequency and that are in phase.

In addition, before the switch to the new frequency occurs, phase alignment of the clock signals with other domain clock signals is performed. That is, the phases of the clock signals supplied by column clock generators 420a and 420c are made to align with the phases of the other clock signals being generated by domain clock generator 410, so that blocks (or combination of blocks) in different columns can communicate with each other if necessary. Accordingly, in one embodiment, the edges of the clock pulses supplied by column clock generators 420a and 420c are allowed to align with the other domain clock signals supplied to the array of analog blocks 20.

In summary, the present invention provides a system for establishing and maintaining phase and frequency alignment of the clock signals supplied to a combination of analog blocks in a dynamically programmable, multi-functional system-on-a-chip architecture. The present invention establishes phase and frequency alignment of the clock signals for all of the blocks in a combination of blocks regardless of the column the blocks are in. The present invention also provides a system for establishing phase and frequency alignment between analog blocks after there is a dynamic change in configuration and function. The solution provided by the present invention reduces costs and efficiently uses the limited area available in devices as small as microcontrollers, by limiting the number of clocks that are used and hence also limiting the amount of routing needed for those clocks.

The preferred embodiment of the present invention, method for synchronizing and resetting clock signals supplied to multiple programmable analog blocks, is thus described. While the present invention has been described in particular embodiments, it should be appreciated that the present invention should not be construed as limited by such embodiments, but rather construed according to the following claims.

What is claimed is:

1. A method for providing clock signals to a multi-functional device, said method comprising:
   a) selecting and electrically coupling analog blocks to form a combination of analog blocks, wherein said analog blocks in said combination are selected from a plurality of analog blocks coupled in a single integrated circuit, said plurality of analog blocks comprising a first set of analog blocks that can be selectively and electrically coupled to and decoupled from another analog block, wherein different analog functions are implemented by selectively and electrically coupling different combinations of said analog blocks; and
   b) supplying a synchronized clock signal to all analog blocks in said combination of analog blocks, wherein said synchronized clock signal is supplied by a plurality of segment clock generators coupled to said combination of analog blocks.

2. The method of claim 1 wherein said first set of analog blocks comprises switched capacitor blocks.

3. The method of claim 1 wherein said plurality of analog blocks is organized into a plurality of segments.

4. The method of claim 3 wherein said segments are coupled to said plurality of segment clock generators, wherein each segment is coupled to one segment clock generator.

5. The method of claim 4 wherein said step b) comprises:
   receiving at a segment clock generator a plurality of first clock signals generated by a domain clock generator, wherein said first clock signals are at different frequencies.

6. The method of claim 5 wherein said step b) further comprises:
   selecting at said segment clock generator one of said first clock signals.

7. The method of claim 6 wherein said step b) further comprises:
   selecting said one of said first clock signals at said segment clock generator using a multiplexer.

8. The method of claim 6 wherein said combination of analog blocks comprises analog blocks from multiple segments, wherein each segment clock generator coupled to said multiple segments selects a same clock signal from said plurality of first clock signals.

9. The method of claim 6 wherein said step b) further comprises:
   selecting said one of said first clock signals according to information in a memory register.

10. The method of claim 6 further comprising:
    generating a two-phase non-overlapping clock signal from said one of said first clock signals.

11. The method of claim 10 further comprising:
    after selecting said one of said first clock signals, selecting from said plurality of first clock signals a different clock signal; and
    establishing phase alignment between said different clock signal and other clock signals in said plurality of first clock signals.

12. A method for synchronizing clock signals in a multi-functional device comprising a plurality of analog blocks coupled in a single integrated circuit, said method comprising:

a) receiving at a plurality of segment clock generators a plurality of clock signals at different frequencies, said clock signals generated by a domain clock generator;

b) selecting from said plurality of clock signals a first clock signal at a first segment clock generator, said first segment clock generator supplying said first clock signal to a first analog block in a first segment of analog blocks;

c) selecting said first clock signal at a second segment clock generator, said second segment clock generator supplying said first clock signal to a second analog block in a second segment of analog blocks;

wherein said first and second analog blocks are electrically coupled and in combination perform a function.

13. The method of claim 12 wherein said first and second analog blocks are switched capacitor blocks.

14. The method of claim 12 wherein said first and second segment clock generators each comprise a multiplexer operable to select said first clock signal.

15. The method of claim 12 wherein said first and second segment clock generators are coupled to a memory register, wherein said first clock signal is selected according to information in said memory register.

16. The method of claim 12 comprising:

after selecting said first clock signal, selecting a second clock signal different from said first clock signal.

17. The method of claim 16 further comprising:

establishing phase alignment with other clock signals supplied by said domain clock generator in conjunction with said selecting of said second clock signal.

18. The method of claim 12 comprising:

generating at said first and second segment clock generators a two-phase non-overlapping clock signal from said first clock signal.

19. A method for a synchronizing clock signals in a multi-functional device, said method comprising:

a) selecting and electrically coupling analog blocks to form a combination of analog blocks, wherein said analog blocks in said combination are selected from a plurality of analog blocks coupled in a single integrated circuit and arranged in an array having a plurality of columns, said plurality of analog blocks comprising a first set of analog blocks that can be selectively and electrically coupled to and decoupled from another analog block, wherein different analog functions are implemented by selectively and electrically coupling different combinations of said analog blocks; and b) receiving at a plurality of column clock generators a plurality of clock signals at different frequencies, wherein one column clock generator is coupled to each column in said array of analog blocks; and c) selecting from said plurality of clock signals a same clock signal at each column clock generator coupled to analog blocks in said combination of analog blocks.

20. The method of claim 19 wherein said first set of analog blocks comprises switched capacitor blocks.

21. The method of claim 19 wherein a multiplexer is used by each column clock generator to select said same clock signal from said plurality of clock signals.

22. The method of claim 19 comprising:

selecting said same clock signal at each column clock generator according to information in a memory register.

23. The method of claim 19 comprising:

after selecting said same clock signal at a column clock generator, selecting a different clock signal from said plurality of clock signals.

24. The method of claim 23 further comprising:

establishing phase alignment with other clock signals in said plurality of clock signals in conjunction with said selecting of said different clock signal.

25. The method of claim 19 comprising;

generating at each column clock generator a two-phase non-overlapping clock signal from an input clock signal.

* * * * *